United States Patent
Kim et al.

(10) Patent No.: US 10,235,955 B2
(45) Date of Patent: Mar. 19, 2019

(54) STAGE CIRCUIT AND SCAN DRIVER USING THE SAME

(71) Applicant: Samsung Display Co., Ltd., Yongin-si, Gyeonggi-do (KR)

(72) Inventors: Jong Hee Kim, Yongin-si (KR); Ji Hye Lee, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 92 days.

(21) Appl. No.: 15/160,922

(22) Filed: May 20, 2016

(65) Prior Publication Data
US 2017/0032756 A1    Feb. 2, 2017

(30) Foreign Application Priority Data
Jul. 28, 2015  (KR) .......................... 10-2015-0106678

(51) Int. Cl.
G09G 3/36       (2006.01)
G11C 19/18      (2006.01)
G11C 19/28      (2006.01)

(52) U.S. Cl.
CPC ......... G09G 3/3677 (2013.01); G09G 3/3648 (2013.01); G09G 3/3674 (2013.01);
(Continued)

(58) Field of Classification Search
CPC ............... G09G 3/3677; G09G 3/3696; G09G 2310/06–2310/08; G09G 2310/0286;
(Continued)

(56) References Cited

U.S. PATENT DOCUMENTS 6,345,085 B1 * 2/2002 Yeo .................. G11C 19/00
377/54
9,071,230 B2    6/2015 Kim et al.
(Continued)

FOREIGN PATENT DOCUMENTS

KR    10-2013-0137860 A    12/2013
KR    10-2014-0042308 A     4/2014
(Continued)

OTHER PUBLICATIONS

EPO Extended Search Report dated Dec. 5, 2016 for corresponding European Patent Application No. 16181614.5 (8 pages).

*Primary Examiner* — Roberto W Flores
(74) *Attorney, Agent, or Firm* — Lewis Roca Rothgerber Christie LLP

(57) ABSTRACT

A stage circuit includes an output part configured to supply a carry signal to a first output terminal and a scan signal to a second output terminal, in response to a voltage of a first node, a voltage of a second node, and a first clock signal being supplied to a first input terminal, a controller configured to control the voltage of the second node in response to the first clock signal being supplied to the first input terminal, a pull-up part configured to control the voltage of the first node in response to a carry signal of a previous stage being supplied to a second input terminal, and a pull-down part configured to control the voltage of the first node in response to the voltage of the second node and the carry signal of a next stage being supplied to a third input terminal.

16 Claims, 7 Drawing Sheets

(52) U.S. Cl.
CPC ......... *G09G 3/3696* (2013.01); *G11C 19/184* (2013.01); *G11C 19/28* (2013.01); *G09G 2310/08* (2013.01)

(58) Field of Classification Search
CPC ... G09G 2310/0289; G09G 2310/0294; G11C 29/86; G11C 29/20
USPC ...................................... 345/100; 377/64–81
See application file for complete search history.

(56) References Cited

U.S. PATENT DOCUMENTS

| | | | |
|---|---|---|---|
| 9,087,468 B2 | 7/2015 | Yoon et al. | |
| 9,293,093 B2 | 3/2016 | Kim et al. | |
| 9,294,086 B2 | 3/2016 | Kwon et al. | |
| 2004/0227718 A1* | 11/2004 | Park | G09G 3/3677 345/100 |
| 2005/0220263 A1* | 10/2005 | Moon | G11C 19/00 377/68 |
| 2006/0197554 A1* | 9/2006 | Jinta | G11C 19/184 326/81 |
| 2008/0062071 A1* | 3/2008 | Jeong | G11C 19/184 345/46 |
| 2008/0198961 A1* | 8/2008 | Collins | G09G 3/3688 377/70 |
| 2008/0266477 A1* | 10/2008 | Lee | G09G 3/3677 349/46 |
| 2008/0279327 A1* | 11/2008 | Liu | G11C 19/184 377/64 |
| 2010/0207928 A1* | 8/2010 | Lee | G09G 3/3677 345/213 |
| 2010/0245298 A1* | 9/2010 | Chen | G09G 3/3677 345/204 |
| 2013/0181747 A1 | 7/2013 | Yoon et al. | |
| 2013/0322593 A1* | 12/2013 | Jang | G11C 19/28 377/67 |
| 2013/0328495 A1 | 12/2013 | Woo et al. | |
| 2014/0092078 A1* | 4/2014 | Yoon | G09G 5/001 345/212 |
| 2014/0292628 A1* | 10/2014 | Park | G09G 3/3677 345/100 |
| 2015/0042547 A1 | 2/2015 | Kwon et al. | |
| 2015/0043703 A1 | 2/2015 | Tan et al. | |
| 2015/0206490 A1 | 7/2015 | Lim et al. | |
| 2015/0263722 A1 | 9/2015 | Kim et al. | |
| 2015/0287392 A1 | 10/2015 | Kim et al. | |
| 2015/0358018 A1 | 12/2015 | Kim et al. | |
| 2016/0203762 A1 | 7/2016 | Kim et al. | |
| 2016/0203783 A1 | 7/2016 | Kim et al. | |
| 2016/0203786 A1 | 7/2016 | Lim et al. | |
| 2016/0210890 A1 | 7/2016 | Lim et al. | |
| 2016/0210920 A1 | 7/2016 | Kim et al. | |
| 2016/0210926 A1 | 7/2016 | Amino et al. | |
| 2016/0218707 A1 | 7/2016 | Park et al. | |
| 2016/0267831 A1 | 9/2016 | Seo et al. | |
| 2016/0293131 A1 | 10/2016 | Kim et al. | |

FOREIGN PATENT DOCUMENTS

| | | |
|---|---|---|
| KR | 10-2015-0017810 A | 2/2015 |
| KR | 10-2015-0018970 A | 2/2015 |
| KR | 10-2015-0019098 A | 2/2015 |
| KR | 10-2015-0031899 A | 3/2015 |
| KR | 10-2015-0086973 A | 7/2015 |
| KR | 10-2015-0107937 A | 9/2015 |
| KR | 10-2015-0115105 A | 10/2015 |
| KR | 10-2015-0142708 A | 12/2015 |
| KR | 10-2016-0087950 | 7/2016 |
| KR | 10-2016-0087951 | 7/2016 |
| KR | 10-2016-0087952 | 7/2016 |
| KR | 10-2016-0088469 | 7/2016 |
| KR | 10-2016-0089024 | 7/2016 |
| KR | 10-2016-0089937 | 7/2016 |
| KR | 10-2016-0092584 | 8/2016 |
| KR | 10-2016-0100084 | 8/2016 |
| KR | 10-2016-0110840 A | 9/2016 |
| KR | 10-2016-0119300 A | 10/2016 |

* cited by examiner

STAGE CIRCUIT AND SCAN DRIVER USING THE SAME

CROSS-REFERENCE TO RELATED APPLICATION

This application claims priority to and the benefit of Korean Patent Application No. 10-2015-0106678, filed on Jul. 28, 2015, in the Korean Intellectual Property Office, the entire content of which is incorporated herein by reference in its entirety.

BACKGROUND

1. Field

Aspects of embodiments of the present invention relate to a stage circuit and a scan driver using the same.

2. Description of the Related Art

As information technology advances, the importance of a display device, which is a medium between information and its user, is becoming more and more important. Reflecting such trend, consumption of such display devices as a liquid crystal display device (LCD), an organic light emitting display device (OLED), and a plasma display panel (PDP), is increasing.

Generally, a display device includes a data driver to supply data signals to data lines, a scan driver to supply scan signals to scan lines, and a pixel part that includes pixels located in crossing areas of the scan lines and the data lines.

The pixels included in the pixel area are selected when the scan signals are supplied to the scan lines and receive the data signals from the data lines. The pixels that received the data signals supply light to outside, the light having a brightness corresponding to the data signals.

The scan driver includes stages connected to the scan lines. The stages supply scan signals to the scan lines connected to the stages in response to signals from a timing controller. For this, each of the stages includes a P-type transistor (e.g., PMOS) and/or an N-type transistor (e.g., NMOS) and can be mounted with pixels onto a panel at the same time.

On the other hand, stages mounted on panels occupy certain amounts of mounting area, and accordingly, methods to reduce or minimize mounting area of stages are desired.

SUMMARY

Embodiments of the present invention are directed toward a stage circuit and a scan driver using the same, capable of reducing or minimizing mounting area.

According to some embodiments of the present invention, there is provided a stage circuit including: an output part configured to supply an i-th (where i is a natural number) carry signal to a first output terminal and an i-th scan signal to a second output terminal, in response to a voltage of a first node, a voltage of a second node, and a first clock signal being supplied to a first input terminal; a controller configured to control the voltage of the second node in response to the first clock signal being supplied to the first input terminal; a pull-up part configured to control the voltage of the first node in response to a carry signal of a previous stage being supplied to a second input terminal; and a pull-down part configured to control the voltage of the first node in response to the voltage of the second node and the carry signal of a next stage being supplied to a third input terminal, wherein the pull-down part includes a first capacitor including a first electrode coupled to the first node and a second electrode coupled to the next stage.

In an embodiment, the second electrode of the first capacitor is coupled to the third input terminal.

In an embodiment, the second electrode of the first capacitor is coupled to a second output terminal of the next stage.

In an embodiment, the pull-up part includes a first transistor including: a first electrode; and a gate electrode both coupled to the second input terminal and a second electrode coupled to the first node.

In an embodiment, the stage circuit further includes a first power input terminal configured to receive a first off voltage and a second power input terminal configured to receive a second off voltage different from the first off voltage.

In an embodiment, the output part includes: a second transistor coupled between the first input terminal and the first output terminal, and including a gate electrode coupled to the first node; a third transistor coupled between the first output terminal and the second power input terminal, and including a gate electrode coupled to the second node; a fourth transistor coupled between the first input terminal and the second output terminal, and including a gate electrode coupled to the first node; a fifth transistor coupled between the second output terminal and the first power input terminal, and including a gate electrode coupled to the second node; and a sixth transistor coupled between the second output terminal and the first power input terminal, and including a gate electrode coupled to the third input terminal.

In an embodiment, the controller includes: a seventh transistor including a first electrode and a gate electrode both coupled to the first input terminal; an eighth transistor coupled between a second electrode of the seventh transistor and the second power input terminal, and including a gate electrode coupled to the first output terminal; a ninth transistor coupled between the first input terminal and the second node, and including a gate electrode coupled to the second electrode of the seventh transistor; and a tenth transistor coupled between the second node and the second power input terminal, and including a gate electrode coupled to the first output terminal.

In an embodiment, the pull-down part includes: an eleventh transistor and a twelfth transistor coupled in series between the first node and the second power input terminal, each of the eleventh and twelfth transistors including a gate electrode coupled to the third input terminal; a thirteenth transistor and a fourteenth transistor coupled in series between the first node and the second power input terminal, each of the thirteenth and fourteenth transistors including a gate electrode coupled to the second node; and a fifteenth transistor coupled between the first output terminal and the second power input terminal, and including a gate electrode coupled to the third input terminal.

In an embodiment, the carry signal of the previous stage is an (i−1)-th carry signal or a gate start pulse, and the carry signal of the next stage is a (i+1)-th carry signal.

According to some embodiments of the present invention, there is provided a scan driver including a plurality of stage circuits configured to output a plurality of scan signals to scan lines and to receive a clock signal from the outside, wherein an i-th (where i is a natural number) stage circuit of the plurality of stage circuits includes: an output part configured to supply an i-th carry signal to a first output terminal and an i-th scan signal to a second output terminal, in response to a voltage of a first node, a voltage of a second node, and a first clock signal being supplied to a first input terminal; a controller configured to control the voltage of the second node in response to the first clock signal being supplied to the first input terminal; a pull-up part configured to control the voltage of the first node in response to the carry signal of a previous stage being supplied to a second input terminal; and a pull-down part configured to control the voltage of the first node in response to the voltage of the second node and the carry signal of the next stage being supplied to a third input terminal, wherein the pull-down part includes a first capacitor including a first electrode coupled to a first node and a second electrode coupled to the next stage.

In an embodiment, the second electrode of the first capacitor is coupled to the third input terminal.

In an embodiment, the second electrode of the first capacitor is coupled to a second output terminal of the next stage.

The stage circuit and the scan driver using the same in accordance with an embodiment of the present invention may increase a falling time of a voltage of a node Q and, at the same time, minimize or reduce a rise in voltage. If the falling time of the voltage of the node Q increases, the voltage of the output terminal may fall rapidly, and accordingly reliability may be improved and, at the same time, mounting area of the transistor coupled to the output terminal may be reduced or minimized. Furthermore, if a voltage increase of the node Q is lowered, stress on the transistor coupled to the node Q may be reduced and, at the same time, mounting area may be reduced or minimized.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. Like reference numerals refer to like elements throughout.

DETAILED DESCRIPTION

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
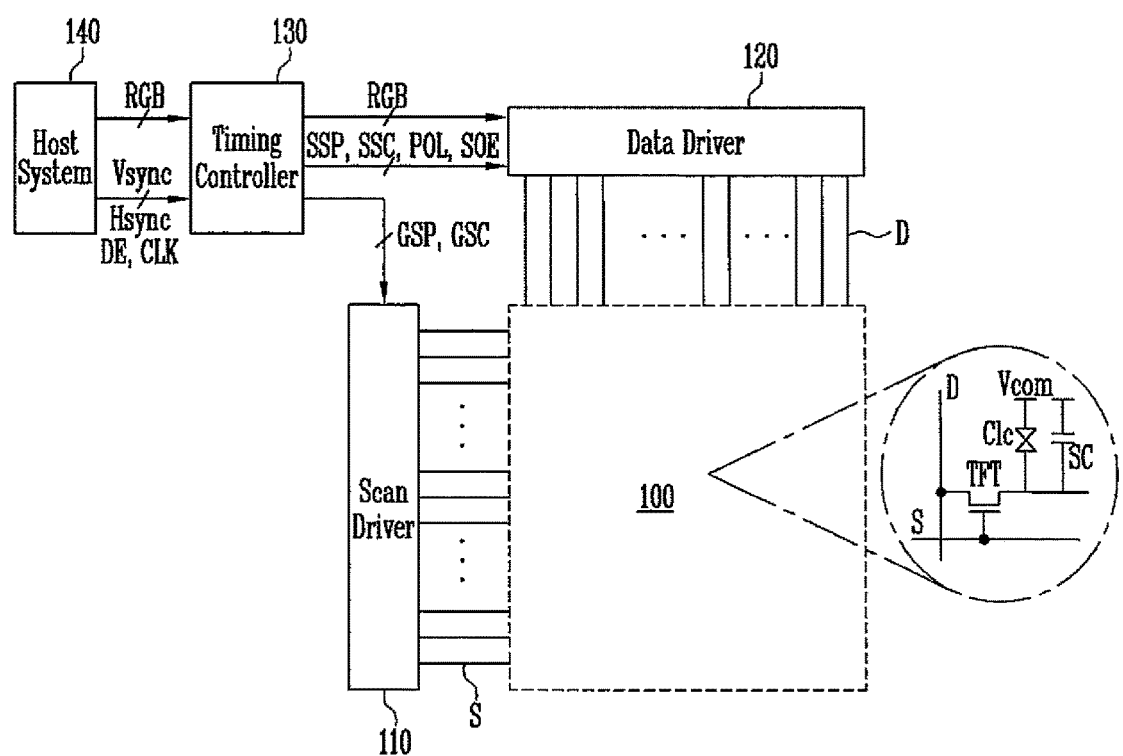
FIG. 1 is a block diagram schematically illustrating a display device in accordance with an embodiment of the present invention.

FIG. 1 is a block diagram schematically illustrating a display device in accordance with an embodiment of the present invention. Although in FIG. 1, the display device is described as a liquid crystal display, for convenience of description, embodiments of the present invention are not limited thereto.

Referring to FIG. 1, the display device in accordance with an embodiment may include a pixel part 100, a scan driver 110, a data driver 120, a timing controller 130, and a host system 140.

The pixel part 100 may refer to an effective display area of a liquid crystal panel. The liquid crystal panel may include a thin film transistor (TFT) substrate and a color filter substrate. A liquid crystal layer may be formed between the TFT substrate and the color filter substrate. Data lines D and scan lines S may be formed on the TFT substrate, and a plurality of pixels may be provided in areas defined by (e.g., sectioned by) the scan lines S and the data lines D.

The TFT may be included in each of the pixels. The TFT may transmit a voltage of a data signal that is supplied via a data line D to a liquid crystal capacitor Clc in response to a scan signal from a scan line S. To this end, a gate electrode of the TFT may be coupled to the scan line S, and a first electrode may be coupled to the data line D. A second electrode of the TFT may be coupled to the liquid crystal capacitor Clc and a storage capacitor SC.

The first electrode may refer to any one of the source electrode of the TFT or the drain electrode of the TFT. The second electrode may refer to an electrode that is different from the first electrode. For example, but without limitation thereto, if the first electrode is set as the drain electrode, the second electrode may be set as the source electrode. The liquid crystal capacitor Clc is an equivalent expression of a liquid crystal between a pixel electrode formed on the TFT substrate and a common electrode. The storage capacitor SC may maintain a voltage of the data signal transmitted to a pixel electrode for a certain amount of time until the next data signal is supplied.

On the color filter substrate, a black matrix, a color filter and the like may be formed.

The common electrode may be formed on the color filter substrate in a vertical field driving mode, such as a twisted nematic (TN) mode and a vertical alignment (VA) mode. The common electrode may be formed on a TFT substrate in a horizontal field driving mode, such as an in plane switching (IPS) mode and a fringe field switching (FFS) mode, together with the pixel electrode. A common voltage Vcom may be supplied to the common electrode. A liquid crystal mode of a liquid crystal panel may be implemented, not only in the TN mode, the VA mode, the IPS mode and/or the FFS mode, but also in any suitable liquid crystal mode.

The data driver 120 may generate positive/negative analog data voltages by changing image data RGB input from the timing controller 130 into a positive/negative gamma compensation voltage. The positive/negative analog data voltages generated by the data driver 120 may be supplied to the data lines D as data signals.

Figure 2:
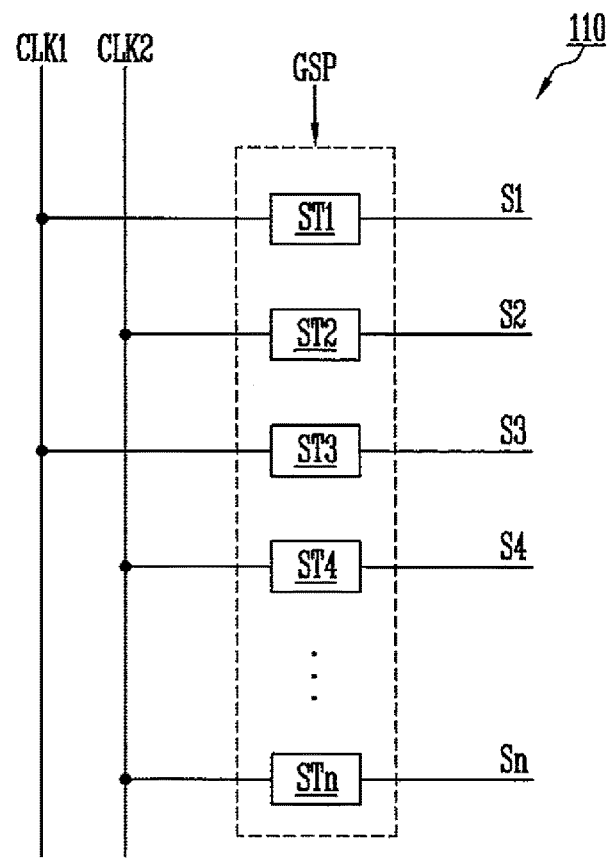
FIG. 2 is a schematic view of a scan driver shown in FIG. 1.

The scan driver 110 may supply scan signals to the scan lines S. For example, but without limitation thereto, the scan driver 110 may supply scan signals to the scan lines S in order (e.g., in a sequential manner). When the scan signals have been supplied to the scan lines S in order, pixels may be selected by horizontal lines, and the pixels selected by the scan signals may be supplied with data signals. For this, the scan driver 110 may include a stage ST, which is connected to each of the scan lines S as shown in FIG. 2. The scan driver 110 may be mounted on a liquid crystal panel in the form of an amorphous silicon gate driver (ASG). In other words, the scan driver 110 may be mounted on a TFT substrate through a thin film process. In addition, the scan drivers 110 may be mounted on both sides of the liquid crystal panel, with the pixel part 100 therebetween.

The timing controller 130, based on timing signals (such as an image data RGB), a vertical synchronization signal Vsync, a horizontal synchronization signal Hsync, a data enable signal DE, and a clock signal CLK, may supply gate control signals to the scan driver 110 and may supply data control signals to the data driver 120.

The gate control signals may include a gate start pulse GSP, one or more gate shift clocks GSC, and/or the like. The gate start pulse GSP may control the timing of the first scan signal. The gate shift clock GSC may shift the gate start pulse GSP by one or more clock cycles.

The data control signals may include a source start pulse SSP, a source sampling clock SSC, a source output enable signal SOE, a polarity control signal POL, and/or the like. The source start pulse SSP controls the starting point of data sampling of the data driver 120. The source sampling clock SSC may control a sampling operation of the data driver 120 with reference to a rising or falling edge. The source output enable signal SOE may control the output timing of the data driver 120. The polarity control signal POL may reverse the polarity of the data signals output from the data driver 120 on j (where j is a natural number) horizontal period cycles.

The host system 140 may supply image data RGB to the timing controller 130 through an interface, such as low voltage differential signaling (LVDS) and transition minimized differential signaling (TMDS). In addition, the host system 140 may supply timing signals Vsync, Hsync, DE, and CLK to the timing controller 130.

FIG. 2 is a schematic view of the scan driver shown in FIG. 1.

Referring to FIG. 2, the scan driver 110 may include a plurality of stages ST1 to STn. Each of the stages ST1 to STn may be coupled to any one of the scan lines S1 to Sn and supply scan signals to the scan lines S1 to Sn in response to the gate start pulse GSP. An i-th stage STi (where i is a natural number) may be coupled to an i-th scan line Si and supply scan signal to the i-th scan line Si.

Each of the stages ST1 to STn may, as a gate shift clock GSC, be supplied with any one of the clock signals CLK1 or CLK2 supplied from the timing controller 130. For example, but without limitation thereto, the odd-numbered stages ST1, ST3, etc. may be driven by the first clock signal CLK1, and the even-numbered stages ST2, ST4, etc. may be driven by the second clock signal CLK2.

Figure 5:
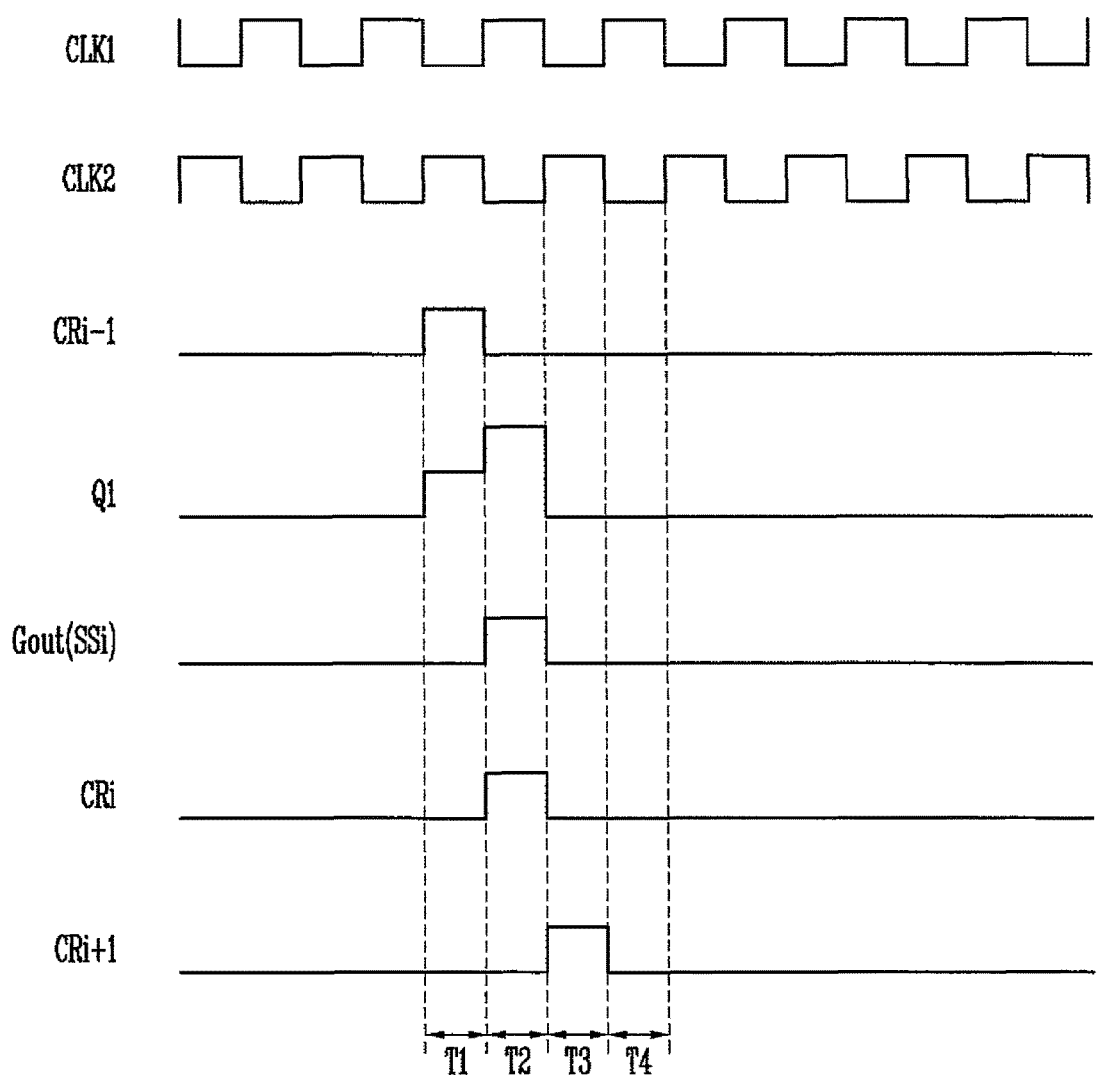
FIG. 5 is a waveform diagram illustrating a driving method of a stage circuit shown in FIG. 4.

As shown in FIG. 5, the first clock signal CLK1 may be a square wave signal, which cycles between a high level voltage and a low voltage and a low level voltage as shown in FIG. 5. The high level voltage of the first clock signal CLK1 may be set to a gate on voltage, and the low level voltage to a second off voltage VSS2 shown in FIG. 3.

The second clock signal CLK2 may be a square wave signal, which cycles between a high level voltage and a low level voltage. The high level voltage of the second clock signal CLK2 may be set to the gate on voltage, and the low level voltage to the second off voltage VSS2. The second clock signal CLK2 may be set to have a reverse phase from that of the first clock signal CLK1.

Although the scan driver 110 is described as being supplied with two clock signals CLK1 and CLK2, it is not limited thereto. For example, but without limitation thereto, the scan driver 110 may be supplied with two or more clock signals in response to scan signals supplied to the scan lines S1 to Sn.

Furthermore, even though FIG. 2 illustrates only n number of stages ST1 to STn, embodiments of the present invention are not limited thereto. For example, but without limitation thereto, the scan driver 110 may additionally include a plurality of dummy stages in order to generate signals generated by previous stages.

Figure 3:
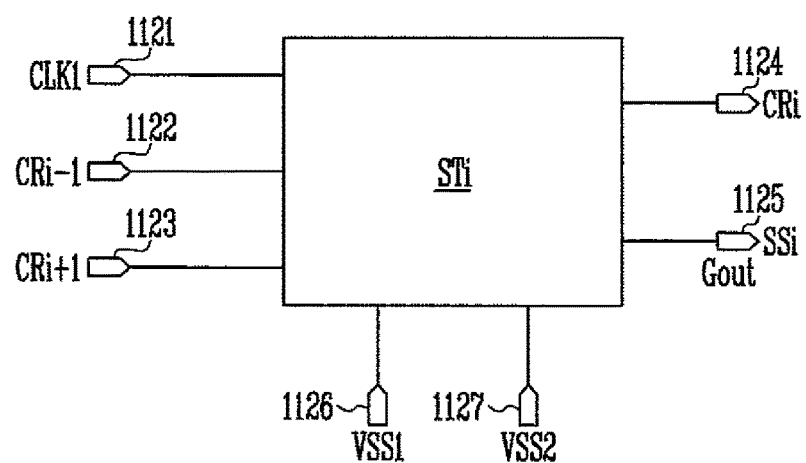
FIG. 3 is a schematic view of terminals connected to a stage.

FIG. 3 is a schematic view of terminals coupled to a stage. For convenience of illustration, the i-th stage STi is depicted in FIG. 3.

Referring to FIG. 3, the i-th stage STi may include a first input terminal 1121, a second input terminal 1122, a third input terminal 1123, a first output terminal 1124, a second output terminal 1125, a first power input terminal 1126, and a second power input terminal 1127.

The first input terminal 1121 may be supplied with the first clock signal CLK1.

The second input terminal 1122 may be supplied with (i−1)-th carry signal CRi−1 from the previous stage STi−1. If the i-th stage STi is the first stage, the gate start pulse GSP may be supplied to the second input terminal 1122.

The third input terminal 1123 may be supplied with (i+1)-th carry signal Cri+1 from the next stage STi+1.

The first output terminal 1124 may supply the carry voltage CRi of the i-th stage STi to the previous and next stages STi−1 and STi+1.

The second output terminal 1125 or Gout may supply the scan signals SSi of the i-th stage STi to the i-th scan Line.

The first power input terminal 1126 may be supplied with a first off voltage VSS1, and the second power input terminal 1127 may be supplied with a second off voltage VSS2. The second off voltage may be set to a voltage that is lower than the first off voltage VSS1 In addition, although the first off voltage VSS1 and the second off voltage VSS2 may be used in order to completely turn off the transistor, they are not limited thereto. For example, but without limitation thereto, the first off voltage may VSS1 may be supplied to the first power input terminal 1126 and the second power input terminal 1127.

Figure 4:
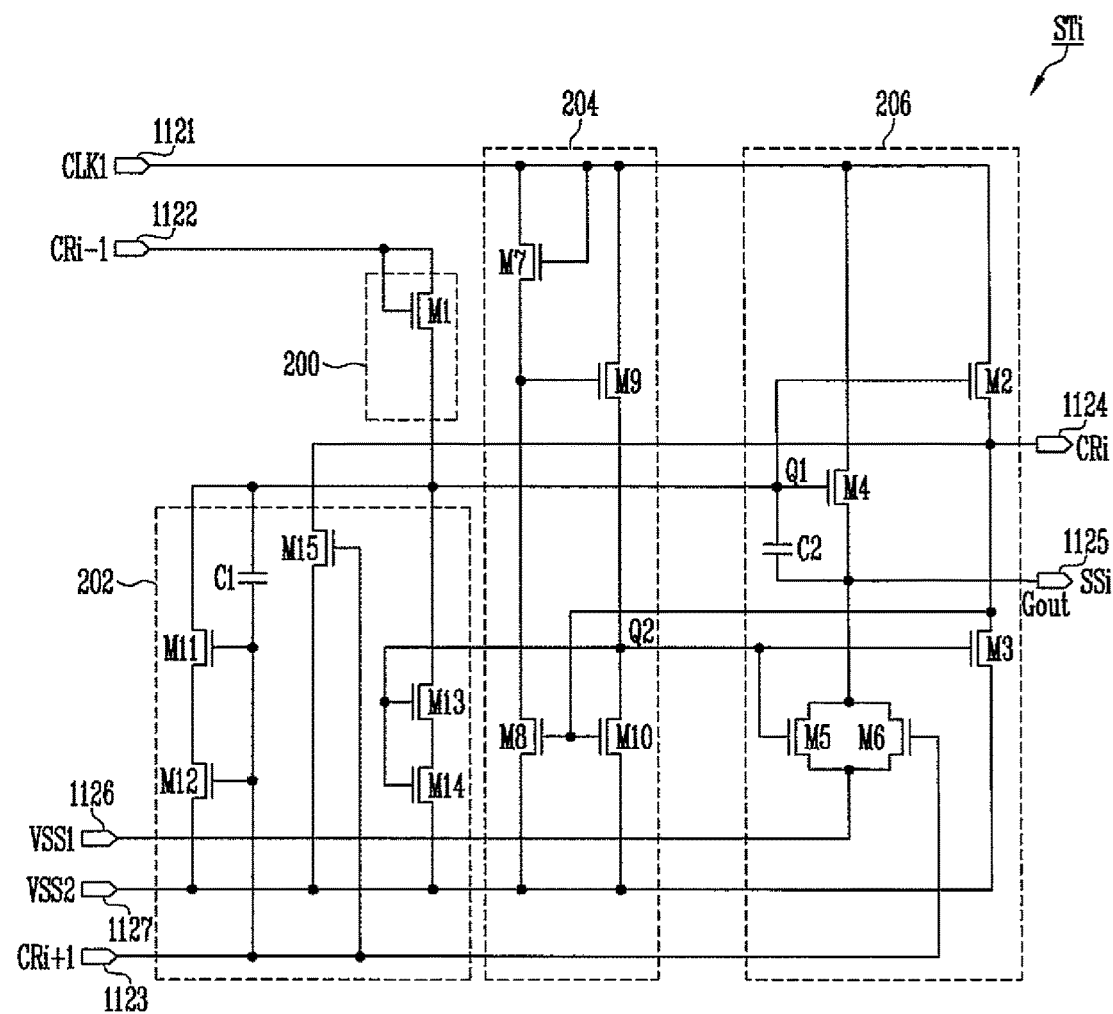
FIG. 4 illustrates a circuit in accordance with an embodiment of a stage shown in FIG. 3.

FIG. 4 illustrates a circuit in accordance with an embodiment of the stage shown in FIG. 3.

Referring to FIG. 4, a stage STi in accordance with an embodiment may include a pull-up part 200, a pull-down part 202, a controller 204, and an output part 206.

The pull-up part 200 may control a voltage of a first node Q1 in response to (i−1)-th carry signal CRi−1. For this, the pull-up part may include a first transistor M1.

A first electrode and a gate electrode of the first transistor M1 may be coupled to a second input terminal 1122, and a second electrode may be coupled to the first node Q1. In other words, the first transistor M1 may be coupled in the form of a diode (e.g., be diode connected) and may be turned on when (i−1)-th carry signal CRi−1 is supplied to the second input terminal 1122.

An output part 206 may output a carry signal CRi to the first output terminal 1124 and a scan signal SSi to the second output terminal 1125 in response to voltages of the first clock signal CLK1, the first node Q1, and the second node Q2. In some examples, the output part 206 may include the second transistor M2 to the sixth transistor M6, and the second capacitor C2.

The first electrode of the second transistor M2 may be coupled to the first input terminal 1121, and the second electrode may be coupled to the first output terminal 1124. The gate electrode of the second transistor M2 may be coupled to the first node Q1. The second transistor M2 may control the connection between the first input terminal 1121 and the first output terminal 1124 by being turned on and off in response to the voltage of the first node Q1.

The first electrode of the third transistor M3 may be coupled to the first output terminal 1124, and the second electrode may be coupled to the second power input terminal 1127. And the gate electrode of the third transistor M3 may be coupled to the second node Q2. The third transistor M3 controls the connection between the first output terminal 1124 and the second power input terminal 1127 by being turned on and off in response to the voltage of the second node Q2.

The first electrode of the fourth transistor M4 may be coupled to the first input terminal 1121, and the second electrode may be coupled to the second output terminal 1125. The gate electrode of the fourth transistor M4 may be coupled to the first node Q1. The fourth transistor M4 may control the connection between the first input terminal 1121 and the second output terminal 1125 by being turned on and off in response to the voltage of the first node Q1.

The first electrode of the fifth transistor M5 may be coupled to the second output terminal 1125, and the second electrode may be coupled to the first power input terminal 1126. And the gate electrode of the fifth transistor M5 may be coupled to the second node Q2. The fifth transistor M5 may control the connection between the second output terminal 1125 and the first power input terminal 1126 by being turned on and off in response to the voltage of the second node Q2.

The first electrode of the sixth transistor M6 may be coupled to the second output terminal 1125, and the second electrode may be coupled to the first power input terminal 1126. And the gate electrode of the sixth transistor M6 may be coupled to the third input terminal 1123. The sixth transistor M6 may electrically couple the second output terminal 1125 and the first power input terminal 1126 by being turned on when the (i+1)-th carry signal Cri+1 is supplied.

The second capacitor C2 may be coupled between the first node Q1 and the second output terminal 1125. The second capacitor C2 may serve as a boosting capacitor. In other words, the second capacitor C2 increases the voltage of the first node Q1 in response to the voltage increase of the second output terminal 1125 when the fourth transistor M4 is turned on, and accordingly, the fourth transistor M4 may maintain the turn on status in a stable manner.

The controller 204 may control the voltage of the second node Q2 in response to the first clock signal CLK1 supplied to the first input terminal 1121. For this, the controller 204 may include the seventh transistor M7 to the tenth transistor M10.

The first electrode and the gate electrode of the seventh transistor M7 may be coupled to the first input terminal 1121, and the second electrode may be coupled to the first electrode of the eighth transistor M8 and the gate electrode of the ninth transistor M9. The seventh transistor M7 may be coupled in the form of a diode (e.g., be diode connected) and turned on when the first clock signal CLK1 is supplied to the first input terminal 1121.

The first electrode of the eighth transistor M8 may be coupled to the second electrode of the seventh transistor M7, and the second electrode may be coupled to the second power input terminal 1127. Also, the gate electrode of the eighth transistor M8 may be coupled to the first output terminal 1124. The eighth transistor M8 may be turned on when the carry signal CRi is supplied to the first output terminal 1124.

The first electrode of the ninth transistor M9 may be coupled to the first input terminal 1121, and the second electrode may be coupled to the second node Q2. The gate electrode of the ninth transistor M9 may be coupled to the second electrode of the seventh transistor M7. The ninth transistor M9 may control the connection between the first input terminal 1121 and the second node Q2 by being turned on and off in response to the voltage supplied from the seventh transistor M7.

The first electrode of the tenth transistor M10 may be coupled to the second node Q2, and the second electrode may be coupled to the second power input terminal 1127. The gate electrode of the tenth transistor M10 may be coupled to the first output terminal 1124. The tenth transistor M10 may be turned on when the carry signal CRi is supplied to the first output terminal 1124.

The pull-down part 202 may control the voltages of the first node Q1 and the first output terminal 1124 in response to the voltage of the second node Q2 and the (i+1)-th carry signal CRi+1 supplied to the third input terminal 1123. In some examples, the pull-down part 202 may include the eleventh transistor M11 to the fifteenth transistor M15 and the first capacitor C1.

The eleventh transistor M11 and the twelfth transistor M12 may be coupled in series between the first node Q1 and the second power input terminal 1127. The gate electrodes of the eleventh transistor M11 and the twelfth transistor M12 may be coupled to the third input terminal 1123. The eleventh transistor M11 and the twelfth transistor M12 may electrically couple the first node Q1 and the second power input terminal 1127 by being turned on when the (i+1)-th carry signal CRi+1 is supplied. Additionally, because the transistors M11 and M12 are coupled in series between the first node Q1 and the second power input terminal 1127, the voltage between the first node Q1 and the second power input terminal 1127 may be divided, thereby increasing product life.

The thirteenth transistor M13 and the fourteenth transistor M14 may be coupled in series between the first node Q1 and the second power input terminal 1127. The gate electrodes of the thirteenth transistor M13 and the fourteenth transistor M14 may be coupled to the second node Q2. The thirteenth transistor M13 and the fourteenth transistor M14 control electrical connection between the first node Q1 and the second power input terminal 1127 by being turned on and off in response to the voltage of the second node Q2. Additionally, the transistors M13 and M14 may be coupled in series between the first node Q1 and the second power input terminal 1127. Thus, the voltage between the first node Q1 and the second power input terminal 1127 may be divided, thereby increasing product life.

The first electrode of the fifteenth transistor M15 may be coupled to the first output terminal 1124, and the second electrode may be coupled to the second power input terminal 1127. The gate electrode of the fifteenth transistor M15 may be coupled to the third input terminal 1123. The fifteenth transistor M15 may electrically couple the first output terminal 1124 and the second power input terminal 1127 by being turned on when the (i+1)-th carry signal is supplied.

The first electrode of the first capacitor C1 may be coupled to the first node Q1, and the second electrode may be coupled to the third input terminal 1123. The first capacitor C1 may delay the voltage drop (i.e., reduce the rate of voltage drop) at the first node Q1, and accordingly, the falling time of the voltages of the first output terminal 1124 and the second output terminal 1125 may be reduced. Thus, the stress on the first transistor M1 may be reduce or minimized by lowering or minimizing voltage increase of the first node Q1 of the first capacitor C1. A more detailed description relating thereto will be provided below.

FIG. 5 is a waveform diagram illustrating a driving method of a stage circuit shown in FIG. 4. Hereinafter, supplying clock signals and carry signals may refer to providing a gate on voltage, and stopping the supply of clock signals and carry signals may refer to providing a gate off voltage.

Referring to FIG. 5, first, during a first period T1, an (i−1)-th carry signal CRi−1 may be supplied to a second input terminal 1122. When the (i−1)-th carry signal CRi−1 is supplied, the first transistor M1 may be turned on. When the first transistor M1 is turned on, the (i−1)-th carry signal CRi−1 may be supplied to the first node Q1.

When the (i−1)-th carry signal CRi−1 is supplied to the first node Q1, the second transistor M2 and the fourth transistor M4 may be turned on. When the second transistor M2 and the fourth transistor M4 are turned on, the first output terminal 1124 and the second output terminal 1125 may be electrically coupled to the first input terminal 1121.

During a second period T2, the first clock signal CLK1 may be supplied to the first input terminal 1121. Because the second transistor M2 and the fourth transistor M4 are set to be on, the first clock signal CLK1, which is supplied to the first input terminal 1121, may be supplied to the first output terminal 1124 and the second output terminal 1125. The first clock signal CLK1 supplied to the first output terminal 1124 may be supplied to the previous and next stages as i-th carry signal CRi. The first clock signal CLK1 supplied to the second output terminal 1125 may be supplied to the scan lines Si as a scan signal SSi.

On the other hand, during the second period T2, the voltage of the first node Q1 may increase to a voltage higher than the first clock signal CLK1 due to boosting of the second capacitor C2, and accordingly, the second transistor M2 and the fourth transistor M4 may maintain turn on status in a stable manner. Additionally, the voltage of the first node Q1, which increases during the second period T2, may be determined by a ratio of the second capacitor C2 and the first capacitor C1. In other words, if the first capacitor C1 is coupled to the first node Q1, the voltage increase of the first node Q1 may decrease.

If the voltage increase of the first node Q1 is reduced, the difference between the voltages on both ends of the first transistor M1, that is, the difference between the voltage of the second input terminal 1122 and the voltage of the first node Q1, may be reduced or minimized. If the voltage difference between the voltages of both ends of the first transistor M1 is reduced, stress applied to the first transistor M1 may be reduced or minimized, thus securing reliability of operation. Also, if the voltage difference between the voltages of both ends of the first transistor M1 is reduced, the mounting area of the first transistor M1 may be reduced.

Additionally, the eighth transistor M8 and the tenth transistor M10 may be turned on by the i-th carry signal CRi supplied to the first output terminal 1124 during the second period T2. When the eighth transistor M8 is turned on, the second off voltage VSS2 may be supplied to the gate electrode of the ninth transistor M9. If the tenth transistor M10 is turned on, the second off voltage VSS2 may be supplied to the second node Q2. Therefore, during the second period T2, the second node Q2 may be set to the second off voltage VSS2, and accordingly, the third transistor M3 may maintain a turn off status.

On the other hand, during the second period T2 when the first clock signal CLK1 is supplied to the first input terminal 1121, the seventh transistor M7 may be turned on. The seventh transistor M7 may be coupled in the form of a diode (e.g., be diode connected). Therefore, if the seventh transistor M7 and the eighth transistor M8 have similar channel widths, the gate electrode voltage of the ninth transistor M9 may decrease to the second off voltage VSS2. Furthermore, even when the ninth transistor M9 is turned on, the second node Q2 may maintain the second off voltage VSS2 in a stable manner due to the tenth transistor M10.

During a third period T3, (i+1)-th carry signal CRi+1 may be supplied to the third input terminal 1123. When the (i+1)-th carry signal CRi+1 is supplied to the third input terminal 1123, the sixth transistor M6, the eleventh transistor M11, the twelfth transistor M12, and the fifteenth transistor M15 may be turned on.

If the sixth transistor M6 is turned on, the first off voltage VSS1 may be supplied to the second output terminal 1125 from the first power input terminal 1126. When the fifteenth transistor M15 is turned on, the second off voltage VSS2 may be supplied to the first output terminal 1124 from the second power input terminal 1127.

When the eleventh transistor M11 and the twelfth transistor M12 are turned on, the second off voltage VSS2 may be supplied to the first node Q1. When the second off voltage VSS2 is supplied to the first node Q1, the second transistor M2 and the fourth transistor M4 may be turned off. The second off voltage VSS2 may be supplied to the gate electrode of the fourth transistor M4, and the first off voltage VSS1, which is higher than the second off voltage VSS2, may be supplied to the second electrode. Therefore, during the third period T3, the fourth transistor M4 may be turned off.

Figure 6:
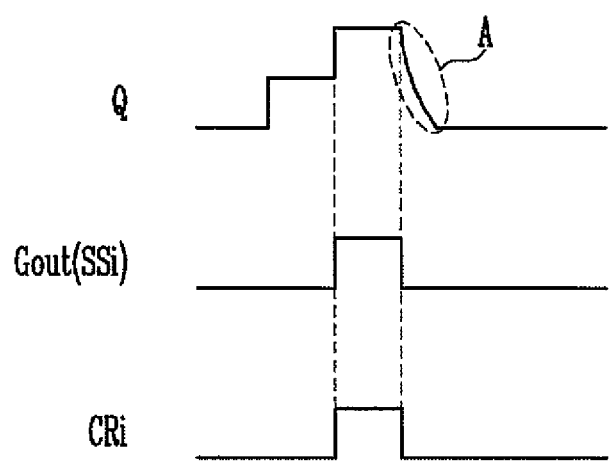
FIG. 6 illustrates a falling time of a node Q shown in FIG. 4.

Additionally, during the third period T3, the falling time of the voltage at the first node Q1 may increase due to the first capacitor C1 and the second capacitor C2. In other words, during the third period T3, the voltage at the first node Q1, as shown in FIG. 6, may drop over a certain amount of time (indicated by "A" in FIG. 6).

When the falling time of the voltage at the first node Q1 increases, the amount of time the fourth transistor M4 is turned on increases, and accordingly, a current caused by a voltage applied to the second output terminal 1125 may concurrently (e.g., simultaneously) be supplied to the first power input terminal 1126 via the sixth transistor M6 and to the first input terminal 1121 via the fourth transistor M4. In other words, the voltage of the second output terminal 1125 may be decreased during the third period T3 using the first power input terminal 1126 and the first input terminal 1121.

In this case, the voltage of the second output terminal 1125 may rapidly decrease, and accordingly, reliability of operations may be improved. Also, the mounting area of the sixth transistor M6 may be reduced or minimized.

In more detail, the sixth transistor M6 may be a transistor to drop the voltage of the second output terminal 1125 and thus it must be formed with a large mounting area. However, if the voltage of the second output terminal 1125 is dropped using the fourth transistor M4 in addition to the sixth transistor MG, as in an embodiment, it may be desirable to reduce or minimize the mounting area of the sixth transistor M6 (e.g., the mounting area of the sixth transistor may be reduced or minimized).

Similarly, when the falling time of the first node Q1 increases, the turn on time of the second transistor M2 may increase, and accordingly, the current due to the voltage applied to the first output terminal 1124 may concurrently (e.g., simultaneously) be supplied to the second power input terminal 1127 via the fifteenth transistor M15 and to the first input terminal 1121 via the second transistor M2.

In this case, the voltage of the first output terminal 1124 may rapidly decrease, and accordingly, reliability of operation may be improved. Also, the mounting area of the fifteenth transistor M15 may be reduced or minimized.

During a fourth period T4, the first clock signal CLK1 may be supplied to the first input terminal 1121. When the first clock signal CLK1 is supplied to the first input terminal 1121, the seventh transistor M7 and the ninth transistor M9 may be turned on. When the ninth transistor M9 is turned on, the voltage of the first clock signal CLK1 may be supplied to the second node Q2.

When the first clock signal CLK1 is supplied to the second node Q2, the third transistor M3, the fifth transistor M5, the thirteenth transistor M13, and the fourteenth transistor M14 may be turned on.

When the third transistor M3 is turned on, the second off voltage VSS2 may be supplied to the first output terminal 1124. When the fifth transistor M5 is turned on, the first off voltage VSS1 may be supplied to the second output terminal 1125. When the thirteenth transistor M13 and the fourteenth transistor M14 are turned on, the second off voltage VSS2 may be supplied to the first node Q1. When the second off voltage VSS2 is supplied to the first node Q1, the second transistor M2 and the fourth transistor M4 may be turned off.

In fact, each of the stages may output scan signals SS and carry signals CR in response to the first period T1 to the fourth period T4.

Figure 7:
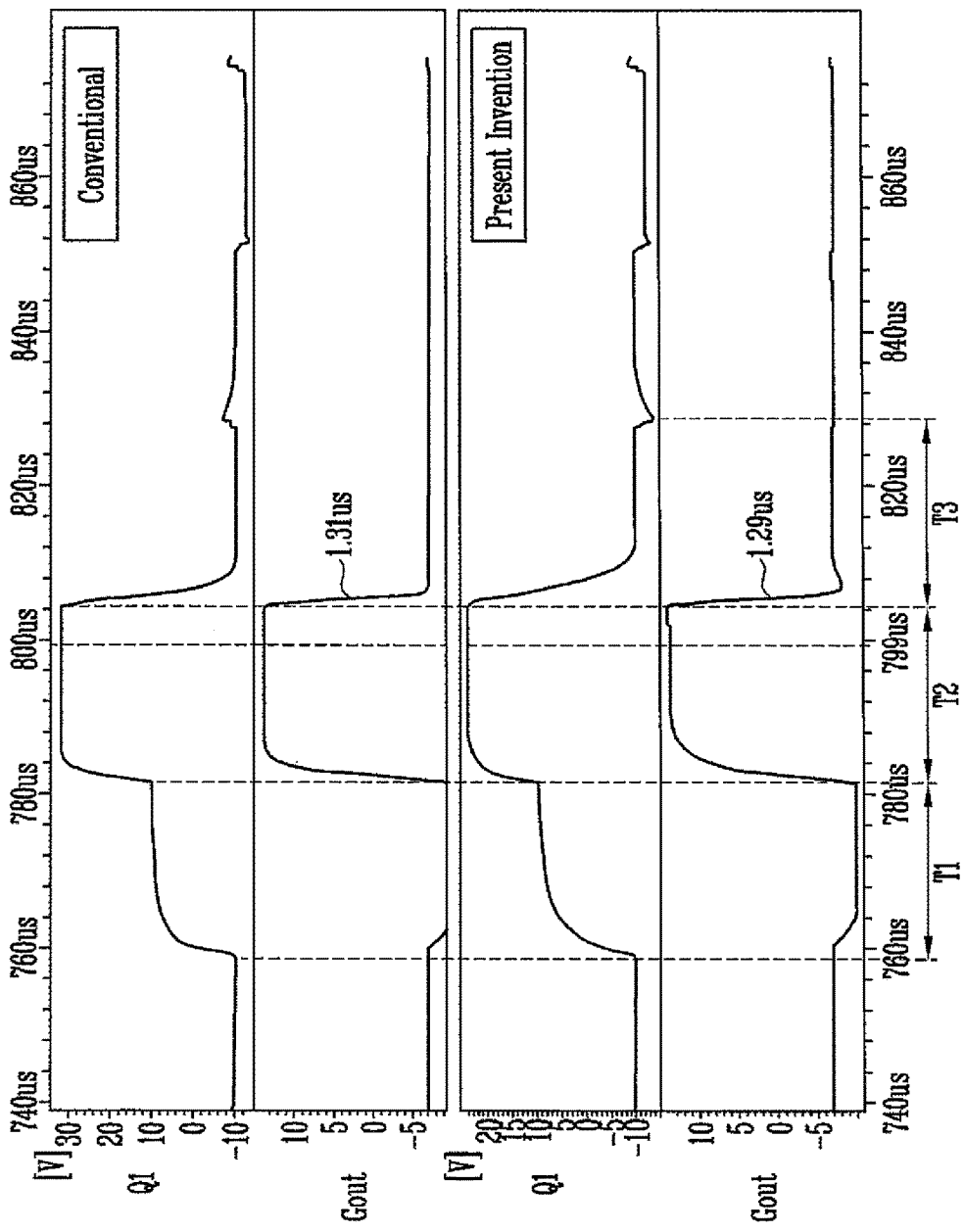
FIG. 7 illustrates results of a simulation in accordance with an embodiment of the present invention.

FIG. 7 illustrates results of a simulation in accordance with an embodiment of the present invention. In FIG. 7, the label "conventional" may refer to the stage circuit in FIG. 4 with the first capacitor C1 removed.

Referring to FIG. 7, during the second period T2, the voltage of the first node Q1 in an embodiment may be set lower than in the conventional device. The amount of voltage increase of the first node Q1 may be reduced by the first capacitor C1 and the second capacitor C2, and accordingly, stress applied to the first transistor M1 may be reduced or minimized. In this case, the mounting area of the first transistor M1 may be reduced or minimized.

Furthermore, in an embodiment, during the third period T3, the falling time of the voltage of the first node Q1 may increase compared to the conventional device, and accordingly, the voltage of the second output terminal 1125 may be rapidly decreased.

Additionally, the i-th stage STi may be driven by the first clock signal CLK1, and the first capacitor C1 that is included in the i-th stage STi, may be driven by the second clock signal CLK2. Here, because the first clock signal CLK1 and the second clock signal CLK2 have reverse phases (e.g., are out of phase by 180°), glitch noise that may occur in the second output terminal 1125 may be reduced or minimized.

Figure 8:
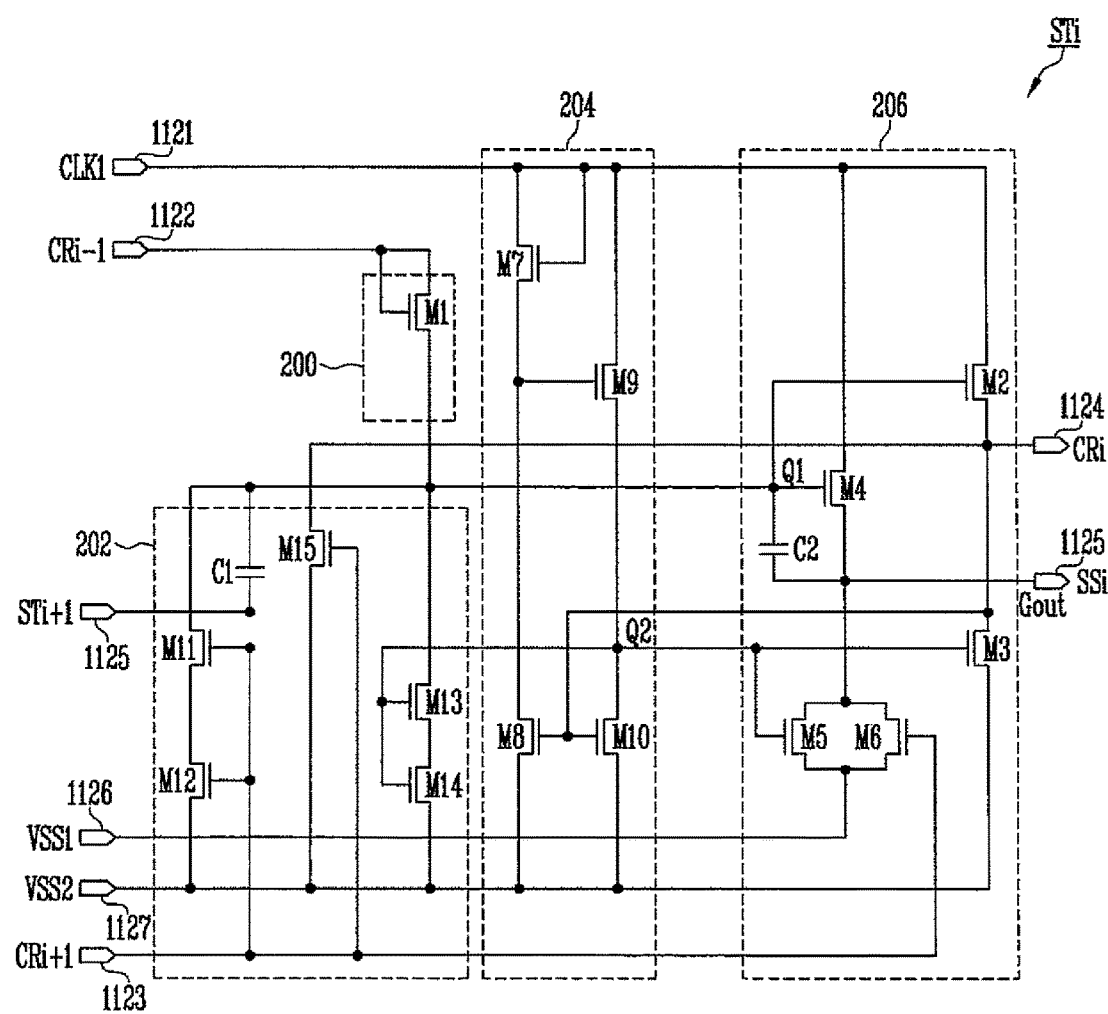
FIG. 8 illustrates a circuit in accordance with an embodiment of a stage shown in FIG. 3.

FIG. 8 illustrates a circuit in accordance with an embodiment of the stage shown in FIG. 3. In describing FIG. 8, the reference numerals for the same configuration as FIG. 4 are the same as those used FIG. 4, and a description thereof may not be repeated below.

Referring to FIG. 8, the first electrode of the first capacitor C1 may be coupled to the first node Q1 in an embodiment, and the second electrode may be coupled to the second output terminal 1125 of the next stage STi+1.

The second output terminal 1125 of the next stage STi+1 may be the same signal as the carry signal CRi+1 of the next stage STi+1. Therefore, operations are substantially the same as in FIG. 4, and a detailed description thereof may not be repeated.

Additionally, for convenience of illustration, transistors are depicted as NMOS. However, embodiments of the present invention are not limited thereto. For example, the transistors may be formed of PMOS.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two elements, it can be the only element between the two elements, or one or more intervening elements may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The stage circuit and scan driver and/or any other relevant devices or components (collectively referred to "circuits") according to embodiments of the present invention described herein may be implemented utilizing any suitable hardware, firmware (e.g. an application-specific integrated circuit), software, or a suitable combination of software, firmware, and hardware. For example, the various components of the circuits may be formed on one integrated circuit (IC) chip or on separate IC chips. Further, the various components of the circuits may be implemented on a flexible printed circuit film, a tape carrier package (TCP), a printed circuit board (PCB), or formed on a same substrate. Further, the various components of the circuits may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and equivalents thereof.

What is claimed is:

1. A stage circuit comprising an input terminal unit including a plurality of input terminals and an output terminal unit including a first output terminal and a second output terminal, the stage circuit further comprising:
   an output part configured to supply an i-th (where i is a natural number) carry signal to the first output terminal and an i-th scan signal to the second output terminal, in response to a voltage of a first node, a voltage of a second node, and a first clock signal being supplied to a first input terminal;
   a controller configured to control the voltage of the second node in response to the first clock signal being supplied to the first input terminal;
   a pull-up part configured to control the voltage of the first node in response to a carry signal of a previous stage being supplied to a second input terminal; and
   a pull-down part configured to control the voltage of the first node in response to the voltage of the second node and a carry signal of a next stage being supplied to a third input terminal,
   wherein the pull-down part comprises a first capacitor comprising a first electrode coupled to the first node and a second electrode coupled to the output terminal unit of the next stage, the first capacitor being configured to reduce a stress of a first transistor of the pull-up part by reducing a voltage increase of the first node during a period between when the carry signal of the previous stage is applied and when the carry signal of the next stage is applied, and
   wherein a same signal as the carry signal of the next stage is supplied to the second electrode of the first capacitor.

2. The stage circuit as claimed in claim 1, wherein the second electrode of the first capacitor is coupled to the third input terminal.

3. The stage circuit as claimed in claim 1, wherein the pull-up part comprises the first transistor comprising:
   a first electrode; and
   a gate electrode both coupled to the second input terminal and a second electrode coupled to the first node.

4. The stage circuit as claimed in claim 1, further comprising a first power input terminal configured to receive a first off voltage and a second power input terminal configured to receive a second off voltage different from the first off voltage.

5. The stage circuit as claimed in claim 4, wherein the output part comprises:
   a second transistor coupled between the first input terminal and the first output terminal, and comprising a gate electrode coupled to the first node;
   a third transistor coupled between the first output terminal and the second power input terminal, and comprising a gate electrode coupled to the second node;
   a fourth transistor coupled between the first input terminal and the second output terminal, and comprising a gate electrode coupled to the first node;
   a fifth transistor coupled between the second output terminal and the first power input terminal, and comprising a gate electrode coupled to the second node; and
   a sixth transistor coupled between the second output terminal and the first power input terminal, and comprising a gate electrode coupled to the third input terminal.

6. The stage circuit as claimed in claim 4, wherein the controller comprises:
   a seventh transistor comprising a first electrode and a gate electrode both coupled to the first input terminal;
   an eighth transistor coupled between a second electrode of the seventh transistor and the second power input terminal, and comprising a gate electrode coupled to the first output terminal;
   a ninth transistor coupled between the first input terminal and the second node, and comprising a gate electrode coupled to the second electrode of the seventh transistor; and
   a tenth transistor coupled between the second node and the second power input terminal, and comprising a gate electrode coupled to the first output terminal.

7. The stage circuit as claimed in claim 4, wherein the pull-down part comprises:
   an eleventh transistor and a twelfth transistor coupled in series between the first node and the second power input terminal, each of the eleventh and twelfth transistors comprising a gate electrode coupled to the third input terminal;
a thirteenth transistor and a fourteenth transistor coupled in series between the first node and the second power input terminal, each of the thirteenth and fourteenth transistors comprising a gate electrode coupled to the second node; and
a fifteenth transistor coupled between the first output terminal and the second power input terminal, and comprising a gate electrode coupled to the third input terminal.

8. The stage circuit as claimed in claim 1,
wherein the carry signal of the previous stage is an (i−1)-th carry signal or a gate start pulse, and
wherein the carry signal of the next stage is an (i+1)-th carry signal.

9. A scan driver comprising a plurality of stage circuits configured to output a plurality of scan signals to scan lines and to receive a clock signal from the outside,
wherein an i-th (where i is a natural number) stage circuit of the plurality of stage circuits comprises:
an output part comprising an output terminal unit including a first output terminal and a second output terminal, and configured to supply an i-th carry signal to the first output terminal and an i-th scan signal to the second output terminal, in response to a voltage of a first node, a voltage of a second node, and a first clock signal being supplied to a first input terminal;
a controller configured to control the voltage of the second node in response to the first clock signal being supplied to the first input terminal;
a pull-up part configured to control the voltage of the first node in response to a carry signal of a previous stage being supplied to a second input terminal; and
a pull-down part configured to control the voltage of the first node in response to the voltage of the second node and a carry signal of a next stage being supplied to a third input terminal,
wherein the pull-down part comprises a first capacitor comprising a first electrode coupled to a first node and a second electrode coupled to the output terminal unit of the next stage, the first capacitor being configured to reduce a stress of a first transistor of the pull-up part by reducing a voltage increase of the first node during a period between when the carry signal of the previous stage is applied and when the carry signal of the next stage is applied, and
wherein a same signal as the carry signal of the next stage is supplied to the second electrode of the first capacitor.

10. The scan driver as claimed in claim 9, wherein the second electrode of the first capacitor is coupled to the third input terminal.

11. The scan driver as claimed in claim 9, wherein the pull-up part comprises the first transistor comprising:
a first electrode; and
a gate electrode both coupled to the second input terminal and a second electrode coupled to the first node.

12. The scan driver as claimed in claim 9, further comprising a first power input terminal configured to receive a first off voltage and a second power input terminal configured to receive a second off voltage different from the first off voltage.

13. The scan driver as claimed in claim 12, wherein the output part comprises:
a second transistor coupled between the first input terminal and the first output terminal, and comprising a gate electrode coupled to the first node;
a third transistor coupled between the first output terminal and the second power input terminal, and comprising a gate electrode coupled to the second node;
a fourth transistor coupled between the first input terminal and the second output terminal, and comprising a gate electrode coupled to the first node;
a fifth transistor coupled between the second output terminal and the first power input terminal, and comprising a gate electrode coupled to the second node; and
a sixth transistor coupled between the second output terminal and the first power input terminal, and comprising a gate electrode coupled to the third input terminal.

14. The scan driver as claimed in claim 12, wherein the controller comprises:
a seventh transistor comprising a first electrode and a gate electrode both coupled to the first input terminal;
an eighth transistor coupled between a second electrode of the seventh transistor and the second power input terminal, and comprising a gate electrode coupled to the first output terminal;
a ninth transistor coupled between the first input terminal and the second node, and comprising a gate electrode coupled to the second electrode of the seventh transistor; and
a tenth transistor coupled between the second node and the second power input terminal, and comprising a gate electrode coupled to the first output terminal.

15. The scan driver as claimed in claim 12, wherein the pull-down part comprises:
an eleventh transistor and a twelfth transistor coupled in series between the first node and the second power input terminal, each of the eleventh and twelfth transistors comprising a gate electrode coupled to the third input terminal;
a thirteenth transistor and a fourteenth transistor coupled in series between the first node and the second power input terminal, each of the thirteenth and fourteenth transistors comprising a gate electrode coupled to the second node; and
a fifteenth transistor coupled between the first output terminal and the second power input terminal, and comprising a gate electrode coupled to the third input terminal.

16. The scan driver as claimed in claim 9,
wherein the carry signal of the previous stage is an (i−1)-th carry signal or a gate start pulse, and
wherein the carry signal of the next stage is an (i+1)-th carry signal.

* * * * *